(12) United States Patent
Nishikawa

(10) Patent No.: US 6,592,675 B2
(45) Date of Patent: Jul. 15, 2003

(54) ROTATING SUSCEPTOR

(75) Inventor: Katsuhito Nishikawa, San Jose, CA (US)

(73) Assignee: Moore Epitaxial, Inc., Tracy, CA (US)

( * ) Notice: Subject to any disclaimer, the term of this patent is extended or adjusted under 35 U.S.C. 154(b) by 0 days.

(21) Appl. No.: 09/927,744

(22) Filed: Aug. 9, 2001

(65) Prior Publication Data

US 2003/0029384 A1 Feb. 13, 2003

(51) Int. Cl.[7] ........................ H01L 21/306; C23C 16/00
(52) U.S. Cl. ........................ 118/730; 118/728; 118/500; 156/345.55; 204/298.27
(58) Field of Search ................. 118/728, 729, 118/730; 204/298.27

(56) References Cited

U.S. PATENT DOCUMENTS

| | | | |
|---|---|---|---|
| 4,848,272 A | 7/1989 | Ohmura et al. | 118/725 |
| 4,858,558 A | 8/1989 | Ohmura et al. | 118/725 |
| 5,108,792 A | 4/1992 | Anderson et al. | 427/248.1 |
| 5,580,388 A | * 12/1996 | Moore | 118/500 |
| 5,679,165 A | 10/1997 | Maeda et al. | 118/719 |
| 5,772,773 A | * 6/1998 | Wytman | 118/729 |
| 5,782,979 A | 7/1998 | Kaneno et al. | 118/500 |
| 5,788,777 A | 8/1998 | Burk, Jr. | 118/730 |
| 5,795,448 A | 8/1998 | Hurwitt et al. | 204/192.1 |
| 6,213,478 B1 | 4/2001 | Nishikawa | 279/4.08 |

FOREIGN PATENT DOCUMENTS

| | | | | |
|---|---|---|---|---|
| EP | 0957185 | 11/1999 | | |
| FR | 2733253 | 10/1996 | | |
| JP | 61-287219 | 12/1986 | | |
| JP | 63266072 | 11/1988 | | |
| JP | 3-234023 | * 10/1991 | ......... | H01L/21/306 |
| JP | 08-229784 | * 9/1996 | ......... | H01L/21/304 |
| JP | 2000-180056 | * 6/2000 | ......... | H01L/21/304 |
| JP | 2001-168034 A | * 6/2001 | ......... | H01L/21/205 |

\* cited by examiner

*Primary Examiner*—Gregory Mills
*Assistant Examiner*—Ram N Kackar
(74) *Attorney, Agent, or Firm*—Gunnison, McKay & Hodgson, L.L.P.; Serge J. Hodgson

(57) ABSTRACT

A semiconductor processing reactor includes a rotating susceptor having at least one substrate holder for supporting a substrate during processing. A susceptor motor is coupled to the rotating susceptor and a substrate holder motor is coupled to the substrate holder. The susceptor motor controls the rotation of the rotating susceptor and the substrate holder motor controls the rotation of the substrate holder. This allows the rotating susceptor to be rotated independent of the rotation of the substrate holder. Further, the substrate holder lifts the substrate above the rotating susceptor allowing automated loading and unloading of the substrate.

27 Claims, 12 Drawing Sheets

ROTATING SUSCEPTOR

BACKGROUND OF THE INVENTION

1. Field of the Invention

The present invention relates generally to semiconductor processing equipment. More particularly, the present invention relates to a susceptor for a pancake reactor and to a method for using the same.

2. Description of the Related Art

As is well known to those of skill in the art, substrate processing typically involved the formation of one or more layers on the substrate. Generally, the substrate, e.g., silicon wafer, was placed on a susceptor in a semiconductor processing reactor. Process gas was introduced into the semiconductor processing reactor, and a layer was formed on the substrate from the process gas.

To insure uniformity in the characteristics of the substrate, it was important that the formed layer was uniform, e.g., in thickness, across the substrate. To enhance the uniformity of the formed layer, the susceptor upon which the substrate was placed was typically rotated within the semiconductor processing reactor.

Rotating susceptors are well known to those of skill in the art. For example, a rotate susceptor is described in Kaneno et al., U.S. Pat. 5,782,979, hereinafter Kaneno. As shown in FIGS. 14A and 14B of Kaneno, wafer trays, which supported the substrates, were formed with wings. As the susceptor rotated, the process gas hit the wings of the wafer trays and caused the wafer trays to rotate within the susceptor. By rotating the wafer trays, the thickness uniformity of the layer formed on the substrates was improved.

It was important to avoid generating or disturbing particulates within the semiconductor processing reactor as these particulates could contaminate and ruin the substrates. Disadvantageously, as process gas flowed through the semiconductor processing reactor, the process gas had a tendency to disturb or dislodge particulates. For this reason, the flow characteristics of the process gas through the semiconductor processing reactor was important and, more particular, it was desirable to have a uniform flow of process gas through the semiconductor processing reactor.

As described above, Kaneno taught that process gas was used to rotate the wafer trays within the susceptor. This improved the uniformity of the formed layer on the substrates. However, at the same time, this disrupted the flow of process gas through the reactor, which increased the tendency of the process gas to dislodge or disrupt particles and contaminate the substrates. Thus, although thickness uniformity was improved, particulate contamination of the substrates was undesirably increased.

SUMMARY OF THE INVENTION

In accordance with the present invention, a semiconductor processing reactor includes a rotating susceptor having at least one substrate holder. The semiconductor processing reactor further includes a susceptor motor coupled to the rotating susceptor and a substrate holder motor coupled to the substrate holder. The susceptor motor controls the rotation of the rotating susceptor and the substrate holder motor controls the rotation of the substrate holder.

Advantageously, the rotating susceptor is rotated independent of the rotation of the substrate holder. This allows the rotating susceptor and substrate holder to be rotated in a manner optimum for the particular process being performed within the semiconductor processing reactor. For example, the rotating susceptor and the substrate holder are rotated to optimize the thickness uniformity of layer(s) formed on a substrate supported by the substrate holder.

In one embodiment, the substrate holder includes a pocket and a lift. The lift includes a plurality of tabs corresponding to notches in the pocket. The lift is extended during loading and unloading of the substrate to lift the substrate out of a recess of the pocket and to allow automatic loading and unloading of the substrate.

Advantageously, use of the substrate holder for loading and unloading the substrate is substantially faster and more dependable then manually loading and unloading the substrate. Accordingly, throughput of substrates through the semiconductor processing reactor is maximized which, in turn, minimizes the cost of processing substrates.

In one particular embodiment, the semiconductor processing reactor includes a main driver gear and a driveshaft slidably mounted to the main driving gear. A coupling gear is coupled to the main driving gear and is also coupled to a pocket rotation gear of the substrate holder. Thus, by rotating the driveshaft, the substrate holder is rotated.

The substrate holder further includes a lift and a cross pin. The lift rests on the cross pin. The cross pin includes a pin extending through an aperture of the pocket rotation gear. The pin rests on a lift plate mounted to the driveshaft. By moving the driveshaft up and down, the cross pin and lift resting on the cross pin are likewise moved up and down.

Also in accordance with the present invention, a method includes rotating a rotating susceptor with a first motor and rotating a substrate holder of the rotating susceptor with a second motor. Advantageously, the rotating susceptor is rotated independent of the substrate holder.

In one particular embodiment, a main driver gear is coupled to a coupling gear. The coupling gear is coupled to a pocket rotation gear of the substrate holder. The main driver gear is rotated to rotate the substrate holder.

Also in accordance with the present invention, a method of operating a semiconductor processing reactor includes loading a substrate into a recess of a substrate holder of a rotating susceptor of the semiconductor process reactor automatically and without manual intervention. The rotating susceptor is rotated and the substrate holder is rotated.

To load the substrate, a lift of the substrate holder is extended. The substrate is placed on the lift. The lift is retracted to move the substrate into the recess.

The substrate is processed. The processed substrate is unloaded out of the semiconductor processing reactor automatically and without manual intervention. To unload the processed substrate, the lift of the substrate holder is extended. The processed substrate is removed from the lift. After the processed substrate is removed, in one embodiment, a new substrate, to be processed, is loaded into the recess of the substrate holder automatically and without manual intervention in a manner similar to that described above.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1A:
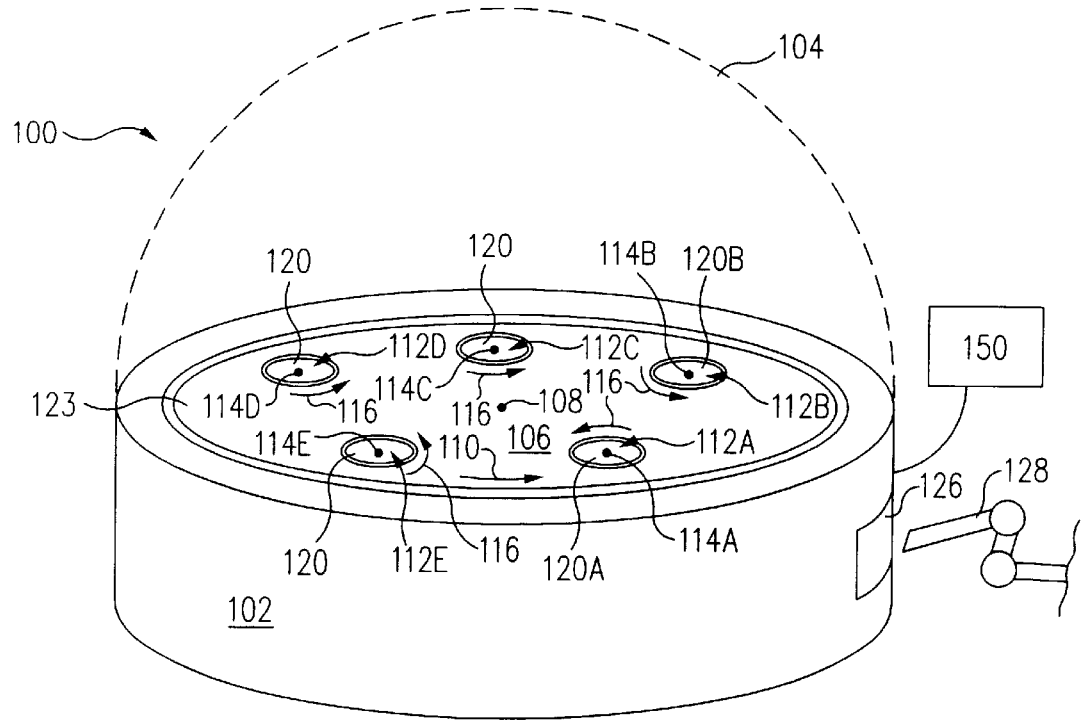
FIG. 1A is a perspective view of a pancake reactor in accordance with the present invention.

A rotating susceptor 106 (FIG. 1A) includes substrate holders 112, which supports substrates 120 during processing. Advantageously, rotating susceptor 106 is rotated independent from the rotation of substrate holders 112. This allows rotating susceptor 106 and substrate holders 112 to be independently rotated in a manner optimum for the particular process being performed within pancake reactor 100.

Further, substrate holders 112 (FIG. 1B) lift substrates 120 above rotating susceptor 106 during loading and unloading of substrates 120. Advantageously, use of substrate holders 112 allows substrates 120 to be loaded and unloaded by a robot arm 128 automatically and without manual intervention. Accordingly, throughput of substrates 120 is maximized which, in turn, minimizes the cost of processing substrates 120.

More particularly, FIG. 1A is a perspective view of a pancake reactor 100, sometimes called a semiconductor processing reactor, in accordance with one embodiment of the present invention. Referring now to FIG. 1A, pancake reactor 100 includes a base 102 and a dome 104, e.g., a quartz bell jar or dome. Located within base 102 is a rotating susceptor 106.

Rotating susceptor 106 rotates in a first direction around an axis 108 of rotating susceptor 106. For example, rotating susceptor 106 rotates counterclockwise when viewed from above in the direction of arrow 110. Alternatively, rotating susceptor 106 rotated in a second direction opposite the first direction around axis 108 of rotating susceptor 106. For example, rotating susceptor 106 rotates clockwise when viewed from above in a direction opposite arrow 110. For convenience, the first direction is hereinafter referred to as counterclockwise and the second direction is hereinafter referred to as clockwise.

Rotating susceptor 106 further includes substrate holders 112A, 112B, 112C, 112D and 112E, collectively referred to as substrate holders 112. Substrate holders 112 support substrates 120, e.g., silicon wafers although other substrates are used in other embodiments. Thus, any rotation of substrate holders 112 also rotates substrates 120.

Substrate holders 112A, 112B, 112C, 112D and 112E rotate around their axes 114A, 114B, 114C, 114D and 114E, respectively. For example, substrate holders 112 rotate counterclockwise in the direction of arrows 116. Alternatively, substrate holders 112 rotate clockwise in the direction opposite of arrows 116.

Substrate holders 112 are rotated independent from rotating susceptor 106. For example, both substrate holders 112 and rotating susceptor 106 are rotated counterclockwise in the direction of arrows 110, 116 or clockwise in the direction opposite of arrows 110, 116. Alternatively, substrate holders 112 are rotated clockwise in the direction opposite of arrows 116 and rotating susceptor 106 is rotated counterclockwise in the direction of arrow 110. As yet another alternative, substrate holders 112 are rotated counterclockwise in the direction of arrows 116 and rotating susceptor 106 is rotated clockwise in the direction opposite of arrow 110.

Further, the rotational speed, sometimes called the revolutions per minute (RPM), of rotating susceptor 106 is controlled independent from the rotational speed of substrate holders 112. For example, rotating susceptor 106 is rotated at low speed, or not rotated at all, while substrate holders 112 are rotated at high speed, e.g., 75 RPM. Alternatively, rotating susceptor 106 and substrate holders 112 are all rotated at high speed or at low speed. As yet another alternative, rotating susceptor 106 is rotated at high speed, e.g., 50 RPM, while substrate holders 112 are rotated at low speed, or are not rotated at all.

Advantageously, rotating susceptor 106 and substrate holders 112 are rotated in a manner optimum for the particular process being performed within pancake reactor 100. For example, rotating susceptor 106 and substrate holders 112 are rotated to optimize the thickness uniformity of layer(s) formed on substrates 120.

Figure 1B:
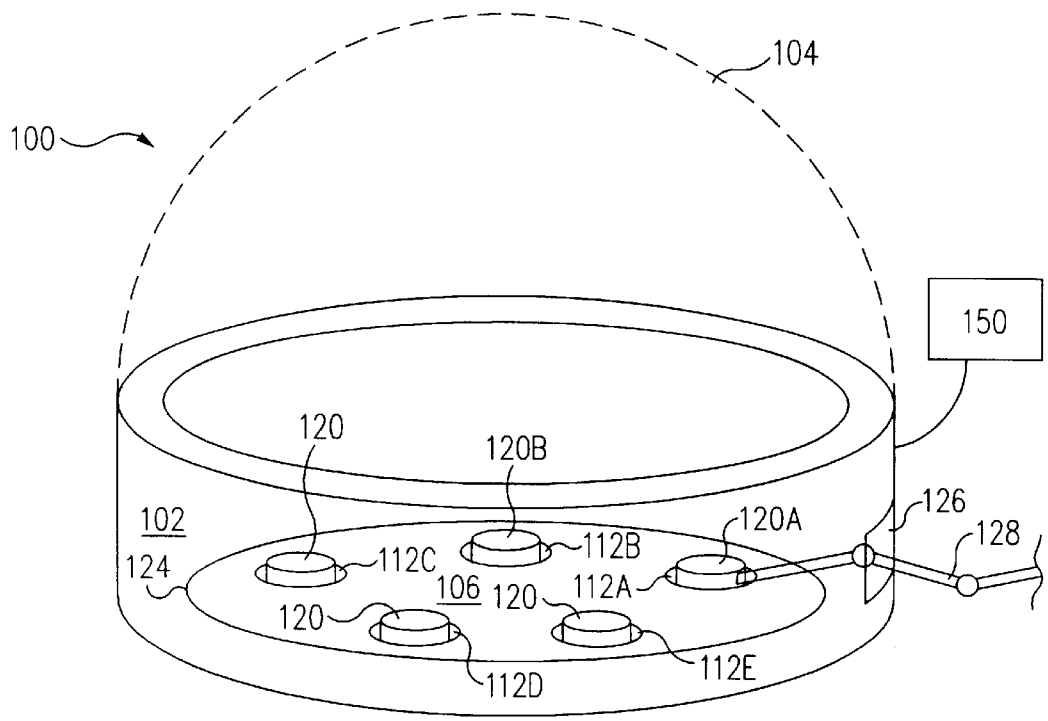
FIG. 1B is a perspective view of the pancake reactor of FIG. 1A during loading and unloading of substrates on substrate holders.

FIG. 1B is a perspective view of pancake reactor 100 of FIG. 1A during loading and unloading of substrates 120 on substrate holders 112. Referring now to FIG. 1B, after substrates 120 are processed, rotating susceptor 106 is lowered from a process position 123 (FIG. 1A) to a load/unload position 124. Substrate holders 112 lift substrates 120 above rotating susceptor 106. To illustrate, substrate holder 112A lifts a first substrate 120A of the plurality of substrates 120 above rotating susceptor 106.

A robot port 126 is opened. A robot arm 128 reaches through robot port 126 and under substrate 120A. Robot arm 128 grasps substrate 120A, e.g., with an end effector of robot arm 128, and removes substrate 120A through robot port 126 and out of pancake reactor 100.

This process is reversed to load a new substrate 120 on to substrate holder 112A. More particularly, robot arm 128 grasps the new substrate 120 (not shown). Robot arm 128 inserts the new substrate 120 through robot port 126. Robot arm 128 places the new substrate 120 on substrate holder 112A. Robot arm 128 withdraws out of robot port 126 and out of pancake reactor 100.

Rotating susceptor 106 rotates until another substrate holder 112, e.g., substrate holder 112B, is aligned with robot port 126. A second substrate 120B of the plurality of substrates 120 is on substrate holder 112B. Substrate 120B is removed by robot arm 128 and a new substrate 120 (not shown) is placed on substrate holder 112B as described above. This procedure is repeated until substrates 120, which have been process, are replaced with new substrate 120 (not shown), to be processed.

As set forth above, substrate holders 112 lift substrates 120 allowing robot arm 128 to reach under substrates 120. Advantageously, substrates 120 are loaded and unloaded from pancake reactor 100 by robot arm 128, i.e., loading and unloading of substrates 120 is automated. Advantageously, use of substrate holders 112 in combination with robot arm 128 for loading and unloading of substrates 120 is substantially faster and more dependable than manually loading and unloading substrates 120. Accordingly, throughput of substrates 120, e.g., the number of substrates 120 processed per hour, is maximized which, in turn, minimizes the cost of processing substrates 120.

Further, use of substrate holders 112 to lift substrates 120 allows robot arm 128 to load and unload substrates 120 through robot port 126. Advantageously, this minimizes any chance of contamination of pancake reactor 100. Specifically, this substantially reduces the possibility of contaminating pancake reactor 100 as compared to having to remove dome 104 to load and unload substrates 120.

Figure 2:
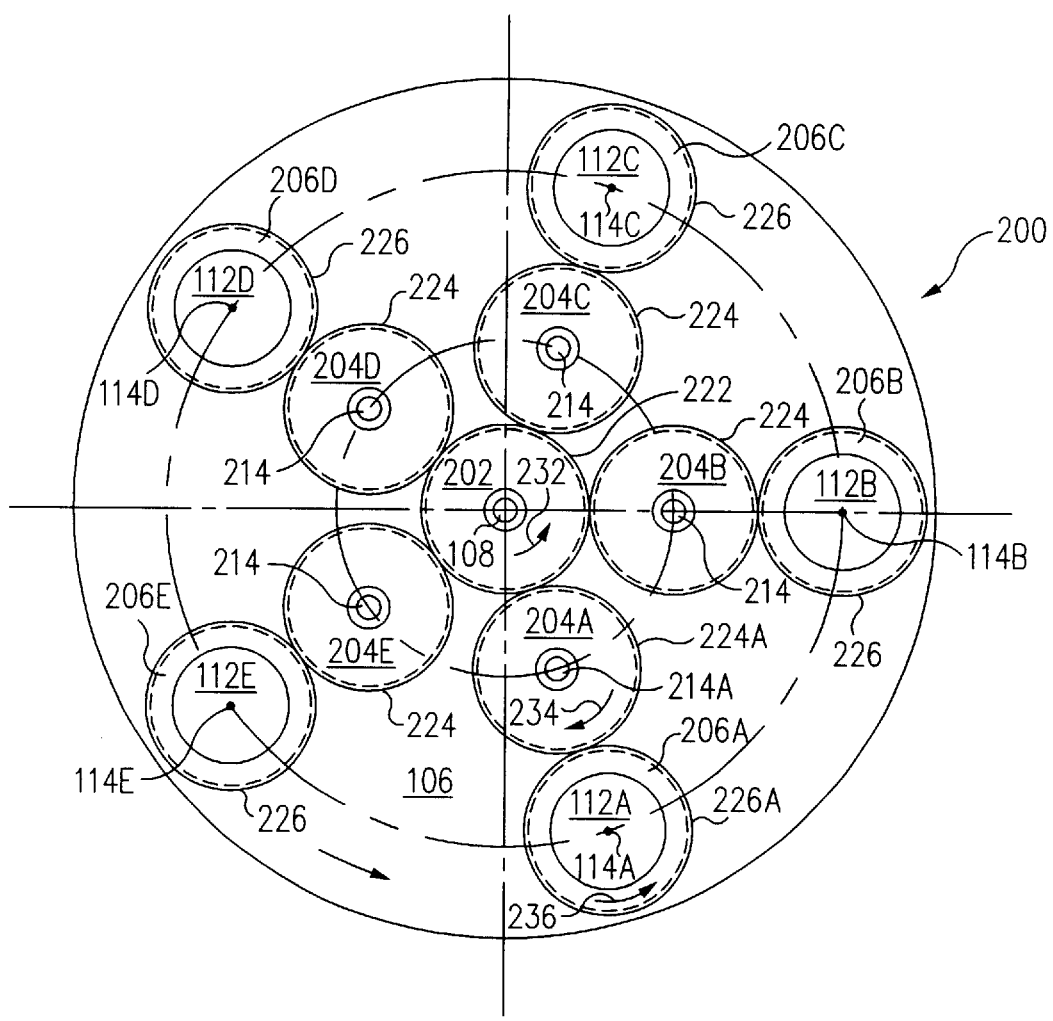
FIG. 2 is a top plan view of a substrate holder gear assembly in accordance with one embodiment of the present invention.

FIG. 2 is a top plan view of a substrate holder gear assembly 200 in accordance with one embodiment of the present invention. Substrate holder gear assembly 200 includes a main driver gear 202, coupling gears 204A, 204B, 204C, 204D, 204E, collectively referred to as coupling gears 204, and pocket rotation gears 206A, 206B, 206C, 206D, 206E, collectively referred to as pocket rotation gears 206. In one embodiment, main driver gear 202, coupling gears 204 and pocket rotation gears 206 are spur gears.

Generally, main driver gear 202, coupling gears 204 and pocket rotation gears 206 are circular when viewed from above as shown in FIG. 2. Further, main driver gear 202, coupling gears 204 and pocket rotation gears 206 have axes 108, 214 and 114, respectively. During use, main driver gear 202, coupling gears 204 and pocket rotation gears 206 rotate around axes 108, 214 and 114, respectively.

Main driver gear 202, coupling gears 204 and pocket rotation gears 206 have circumferential surfaces 222, 224 and 226, respectively. Circumferential surface 222 of main driver gear 202 is coupled, e.g., with teeth or friction, to circumferential surfaces 224 of coupling gears 204. Stated another way, main driver gear 202 is coupled to coupling gears 204.

Circumferential surfaces 224 of coupling gears 204 are also coupled, e.g., with teeth or friction, to circumferential surfaces 226 of pocket rotation gears 206. Stated another way, coupling gears 204 are coupled to pocket rotation gears 206.

In one embodiment, circumferential surfaces 222, 224 and 226 include teeth, which are meshed with one another, to couple circumferential surfaces 224 of coupling gears 204 to circumferential surface 222 of main driver gear 202 and also to circumferential surfaces 226 of pocket rotation gears 206.

During use, main driver gear 202 is rotated as described in greater detail with reference to FIG. 3. Illustratively, main driver gear 202 is rotated counterclockwise around axis 108 when viewed from above as indicated by arrow 232. Since main driver gear 202 is coupled to coupling gears 204, rotation of main driver gear 202 causes an opposite rotation of coupling gears 204.

Specifically, when main driver gear 202 is rotated counterclockwise, coupling gears 204 are rotated clockwise around axes 214 when viewed from above as indicated by arrow 234. For example, coupling gear 204A has a first axis 214A of the plurality of axes 214. Counterclockwise rotation of main driver gear 202 causes coupling gear 204A to rotate clockwise around axis 214 when viewed from above as indicated by arrow 234.

Since coupling gears 204 are coupled to pocket rotation gears 206, rotation of coupling gears 204 causes an opposite rotation of pocket rotation gears 206. Specifically, when coupling gears 204 are rotated clockwise, pocket rotation gears 206 are rotated counterclockwise around axes 114 when viewed from above as indicated by arrow 236. For example, pocket rotation gear 206A has axis 114A. Pocket rotation gear 206A is coupled to coupling gear 204A. Thus, clockwise rotation of coupling gear 204A causes pocket rotation gear 206A to rotate counterclockwise around axis 114A when viewed from above as indicated by arrow 236.

As described in greater detail below with reference to FIG. 3, substrate holder 112A includes pocket rotation gear 206A. Accordingly, rotation of pocket rotation gear 206A causes substrate holder 112A and any substrate supported by substrate holder 112 to rotate. The other substrate holders 112 are rotated by rotating main driver gear 202 in a similar manner and simultaneously.

Although five substrate holders 112 and corresponding pocket rotation gears 206 and coupling gears 204 are described above, it is understood that more or less than five substrate holders 112 and corresponding pocket rotation gears 206 and coupling gears 204 are used in other embodiments.

Figure 3:
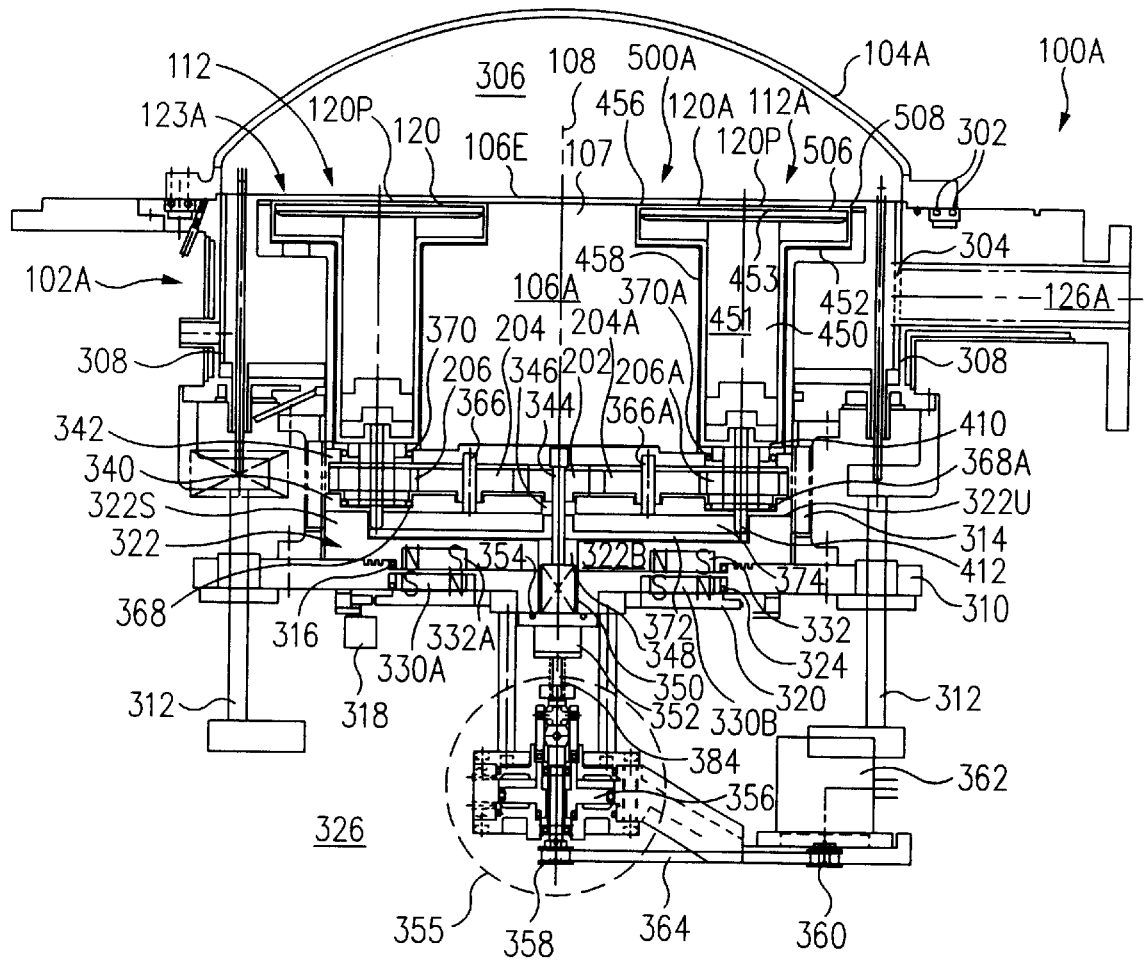
FIG. 3 is a side view, partially in cross-section, of a pancake reactor in accordance with one embodiment of the present invention.

FIG. 3 is a side view, partially in cross-section, of a pancake reactor 100A in accordance with one embodiment of the present invention. Referring now to FIG. 3, pancake reactor 100A includes a dome 104A and a base 102A. One or more O-rings 302 form a seal between dome 104A and base 102A.

Base 102A includes a robot port 126A. A door 304 is between robot port 126A and an internal region 306 inside of pancake reactor 100A. Robot port 126A is mounted to an upper, e.g., first, housing 308 of base 102A. During use of pancake reactor 100A, upper housing 308 and robot port 126A are stationery and do not move.

Base 102A further includes a lower, e.g., second, housing 310. Lower housing 310 is movably mounted on one or more shafts 312. During use of pancake reactor 10A, lower housing 310 slides up, e.g., in a first direction, and down, e.g., in a second direction opposite the first direction, on shafts 312. For example, a motor (not shown) controls this up and down motion of lower housing 310.

A flexible bellows 314 extends between and forms a seal between upper housing 308 and lower housing 310. More particularly, bellows 314 expands and contracts as lower housing 310 moves down and up, respectively, relative to upper housing 308.

A rotating susceptor 106A is rotatably mounted to lower housing 310, e.g., by a bearing 316. A susceptor motor 318 is coupled to rotating susceptor 106A and controls the rotation of rotating susceptor 106A around axis 108, sometimes called a longitudinal axis, of rotating susceptor 106A. Further, rotating susceptor 106A is moved up and down by moving lower housing 310 up and down as described above.

To avoid generation of particulates within internal region 306 and the associated contamination of substrates 120, susceptor motor 318 is magnetically coupled to rotating susceptor 106A through lower housing 310. This magnetic coupling is achieved using an external coupling plate 320 magnetically coupled to an internal coupling plate 322 of rotating susceptor 106A as described below.

External coupling plate 320 is rotatably mounted to lower housing 310 by a bearing 324. Susceptor motor 318 is directly connected, sometimes called coupled, to external coupling plate 320, e.g., with a sprocket, gear, belt or other coupling mechanism. Advantageously, susceptor motor 318 and external coupling plate 320 are located in an external region 326 outside of pancake reactor 10A. Thus, particulates generated by susceptor motor 318 do not enter or contaminated-internal region 306 or substrates 120.

Embedded in external coupling plate 320 are a plurality of external magnets 330, including a first external magnet 330A and a second external magnet 330B. Similarly, embedded in internal coupling plate 322 are a plurality of internal magnets 332, including a first internal magnet 332A. Each of external magnets 330 is located adjacent, and has a magnetic polarity opposite that of a different internal magnet 332, sometimes called a corresponding internal magnet 332. For example, external magnet 330A is aligned with its north pole, south pole towards axis 108, and away from axis 108, respectively. Internal magnet 332A corresponds with external magnet 330A. Accordingly, internal magnet 332A is aligned with its south pole, north pole towards axis 108, and away from axis 108, respectively.

Since opposite poles attract, external magnet 330A is magnetically coupled to internal magnet 332A. More generally, each external magnet 330 is magnetically coupled to its corresponding internal magnet 332. Since external magnets 330 are imbedded in external coupling plate 320 and internal magnets 332 are imbedded in internal coupling plate 322, external coupling plate 320 is magnetically coupled to internal coupling plate 322 through lower housing 310. Accordingly, rotation of external coupling plate 320 around axis 108 produces an equal rotation of internal coupling plate 322 and hence rotates rotating susceptor 106A around axis 108.

In one embodiment, external magnets 330 are arranged so that each of external magnets 330 has a magnetic polarity opposite that of the adjacent magnets of external magnets 330. For example, two external magnets 330 are used, i.e., external magnet 330A and external magnet 330B. External magnet 330A is aligned with its north pole, south pole towards axis 108 and away from axis 108, respectively. Conversely, external magnet 330B is aligned with its south pole, north pole towards axis 108 and away from axis 108, respectively. For simplicity of discussion, two external magnets 330 and corresponding internal magnets 332 are set forth. However, in light of this disclosure, it is understood that more or less than two external magnets 330 and corresponding internal magnets 332 can be used. Typically, four or more external magnets 330 and corresponding internal magnets 332 are used.

Advantageously, external coupling plate 320 is magnetically coupled to internal coupling plate 322 through lower housing 310 and without passing a physical structure through lower housing 310. In this manner, the integrity and dependability of lower housing 310 as a seal between internal region 306 and external region 326 is insured.

Internal coupling plate 322 is a cup shaped enclosure having a circular base plate 322B and an annular sidewall 322S extending up from base plate 322B and around a periphery of base plate 322B. Mounted to an upper surface 322U of sidewall 322S is a lower, e.g., first, gear plate 340. Mounted to lower gear plate 340 is an upper, e.g., second, gear plate 342.

Sandwiched and supported between upper gear plate 342 and lower gear plate 340 is main driver gear 202. Extending through main driver gear 202 is substrate holder drive shaft 344. Drive shaft 344 is slidably mounted in main driver gear 202 such that drive shaft 344 can move up and down along axis 108 relative to main driver gear 202. Illustratively, drive shaft 344 is keyed to main driver gear 202, e.g., drive shaft 344 is a cylindrical shaft with a flat or teeth and main driver gear 202 has an aperture corresponding in shape to the shape of drive shaft 344. Driveshaft 344 is sometimes said to have a spline.

Drive shaft 344 extends through an aperture 346 in lower gear plate 340 and through an aperture 348 in internal coupling plate 322.

Lower housing 310 includes an aperture 350. A rotary-linear seal unit 352, which includes driveshaft 344, is mounted to lower housing 310 and, in this embodiment, extends into aperture 350 of lower housing 310. An O-ring 354 forms a seal between lower housing 310 and rotary-linear seal unit 352.

Drive shaft 344 of rotary-linear seal unit 352 extends through aperture 350 of lower housing 310 and more generally extends from external region 326 into internal region 306. Rotary-linear seal unit 352 allows drive shaft 344 to be rotated and moved up and down, i.e., allows rotation and longitudinal motion of driveshaft 344, respectively, while at the same time prevents process or other gas from leaking through aperture 350 of lower housing 310. One rotary-linear seal unit 352 suitable for use is available from Ferrofluidics Corporation, 40 Simon Street, Nashua, N.H. 03061-2009 under Part No. 52-121577.

In one embodiment, driveshaft 344 is an integral piece, i.e., is a single piece and not a plurality of separate pieces connected together. However, in an alternative embodiment, driveshaft 344 is formed by two or more separate pieces connected together.

Driveshaft 344 extends down from rotary-linear seal unit 352 to a substrate lift motion mechanism 355. Drive shaft 344 is coupled to substrate lift motion mechanism 355. During use, substrate lift motion mechanism 355 rotates driveshaft 344 and also moves driveshaft 344 up and down as described in detail below. One suitable substrate lift motion mechanism 355 is described in detail in Nishikawa, U.S. Pat. No. 6,213,478, issued Apr. 10, 2001, entitled "HOLDING MECHANISM FOR A SUSCEPTOR IN A SUBSTRATE PROCESSING REACTOR", which is herein incorporated by reference in its entirety.

Substrate lift motion mechanism 355 includes a spool 358, which is coupled to drive shaft 344. Spool 358, sometimes called a pulley, is coupled to a spool 360 of a substrate holder motor 362 by a belt 364. During use, substrate holder motor 362 rotates spool 360. This rotation of spool 360 is coupled to spool 358 by belt 364 and hence to drive shaft 344. Thus, substrate holder motor 362 is coupled to drive shaft 344 and controls the rotation of drive shaft 344 and hence main driver gear 202.

As described above in reference to FIG. 2, main driver gear 202 is coupled to coupling gears 204. Coupling gears 204 are mounted between lower gear plate 340 and upper gear plate 342. More particularly, coupling gear spindles 366 are mounted vertically between lower gear plate 340 and upper gear plate 342. Coupling gear spindles 366 extend through apertures in coupling gears 204, i.e., coupling gears 204 are mounted on coupling gear spindles 366. During use, coupling gears 204 rotate around coupling gear spindles 366. To illustrate, coupling gear 204A is mounted on a first coupling gear spindle 366A of the plurality of coupling gear spindles 366. The other coupling gears 204 are mounted on the other coupling gear spindles 366 in a similar manner.

As described above in reference to FIG. 2, coupling gears 204 are coupled to pocket rotation gears 206. Pocket rotation gears 206 are mounted to lower gear plate 340 and upper gear plate 342. More particularly, pocket rotation gears 206 are mounted to lower gear plate 340 by bearings 368. Similarly, pocket rotation gears 206 are mounted to upper gear plate 342 by bearings 370.

To illustrate, pocket rotation gear 206A is mounted to lower gear plate 340 by a first bearing 368A of the plurality of bearings 368. similarly, pocket rotation gear 206A is mounted to upper gear plate 342 by a first bearing 370A of the plurality of bearings 370. The other pocket rotation gears 206 are mounted to lower gear plate 340 and upper gear plate 342 by bearings 368, 370, respectively, in a similar manner.

Accordingly, substrate holder motor 362 is coupled to substrate holders 112 and controls the rotation of substrate holders 112. Advantageously, rotation of substrate holders 112 is controlled by a substrate holder motor 362 independent of rotation of rotating susceptor 106A, which is controlled by susceptor motor 318. This allows rotating susceptor 106A and substrate holders 112 to be rotated independent from one another and in a manner optimum for the particular process to be performed within pancake reactor 10A.

Figure 4:
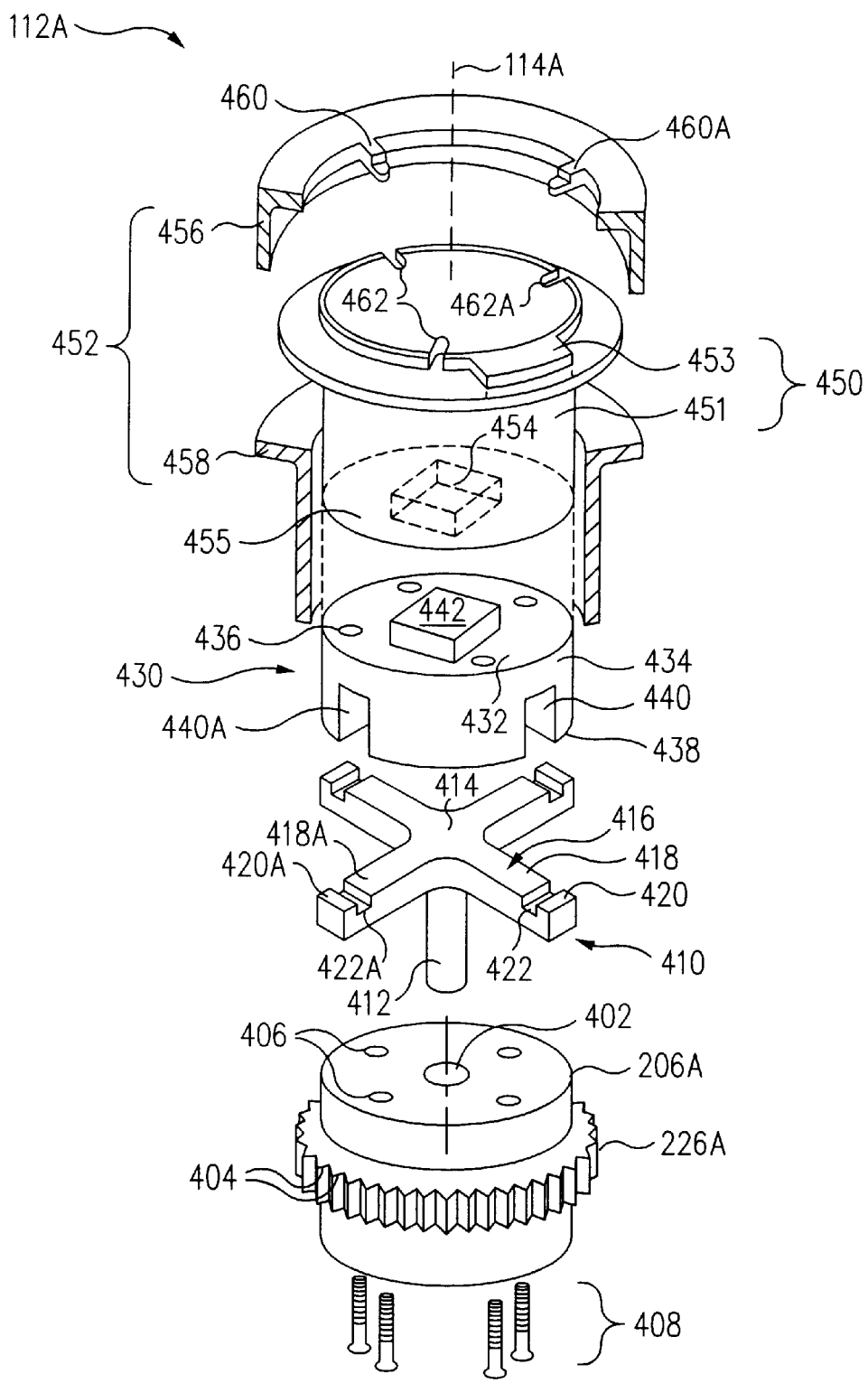
FIG. 4 is an exploded perspective view, partially in cross-section, of a substrate holder of the pancake reactor of FIG. 3 in accordance with one embodiment of the present invention.

FIG. 4 is an exploded perspective view, partially in cross-section, of substrate holder 112A of pancake reactor 100A of FIG. 3 in accordance with one embodiment of the present invention. Referring now to FIG. 4, pocket rotation gear 206A includes a central aperture 402 co-linear with axis 114A of substrate holder 112A. In this embodiment, pocket rotation gear 206A includes a plurality of teeth 404 along circumferential surface 226A of pocket rotation gear 206A.

A cross pin 410 includes a pin 412 co-linear with axis 114A. Pin 412 extends down from a center 414 of a cross member 416, which is in the shape of a cross when viewed from above in this embodiment. Pin 412 extends through central aperture 402 of pocket rotation gear 206A. Illustratively, cross pin 410 and pocket rotation gear 206A are 316L stainless steel although other materials are used in other embodiments.

Cross member 416 includes a plurality of radial arms 418 extending radially outwards from center 414. Although four radial arms 418 are illustrated in FIG. 4, in alternative embodiments, more or less than four radial arms 418 are used.

Each radial arm 418 includes a pressing surface 420, which is perpendicular to axis 114A of substrate holder 112A. Illustratively, a first radial arm 418A of the plurality of radial arms 418 includes a first pressing surface 420A of the plurality of pressing surfaces 420. Pressing surface 420A is perpendicular to axis 114A. The other radial arms 418 include pressing surfaces 420 in a similar manner.

Figure 4A:
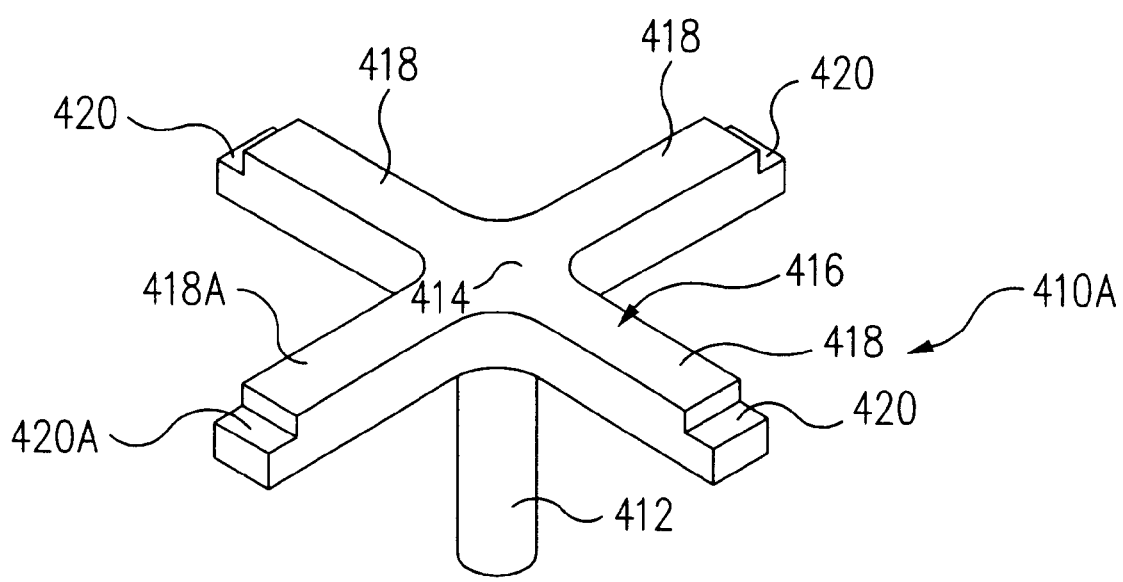
FIG. 4A is a perspective view of a cross pin for use in the substrate holder of FIG. 4 in accordance with an alternative embodiment of the present invention.

In light of this disclosure, those of skill in the art will understand that cross pin 410 can be fabricated in a variety of shapes. For example, referring now to FIG. 4A, a cross pin 410A includes pressing surfaces 420 which are down set.

Referring again to FIG. 4, substrate holder 112A further includes a pocket driver 430 mounted to pocket rotation gear 206A. Pocket driver 430 is mounted to pocket rotation gear 206A such that cross member 416 is sandwiched between pocket driver 430 and pocket rotation gear 206A.

More particularly, pocket driver 430 is a cap shaped enclosure and includes a base section 432 and a cylindrical sidewall 434 extending down from base section 432. In this embodiment, pocket rotation gear 206A includes screw holes 406. Base section 432 of pocket driver 430 includes screw holes 436, which are threaded and which correspond to screw holes 406 of pocket rotation gear 206A.

To mount pocket driver 430 to pocket rotation gear 206A, screws 408 are passed up through screw holes 406 and are threaded into screw holes 436 of pocket driver 430.

Sidewall 434 includes a pocket rotation gear mating surface 438 opposite base section 432. When pocket driver 430 is mounted to pocket rotation gear 206A, pocket rotation gear mating surface 438 presses down on pocket rotation gear 206A.

Sidewall 434 further includes a plurality of notches 440, extending up from pocket rotation gear mating surface 438. Radial arms 418 extend outwards through notches 440 such that pressing surfaces 420 of radial arms 418 are exposed and facing up directly adjacent to sidewall 434.

To illustrate, radial arm 418A extends outwards through a first notch 440A of the plurality of notches 440. Pressing surface 420A of radial arm 418A is exposed and faces up directly adjacent to sidewall 434 of pocket driver 430. The other radial arms 418 extending through the other notches 440 in a similar manner.

To allow a greater range of motion of cross pin 410 relative to pocket driver 430 as described in greater detail below in reference to FIGS. 5A, 5B, radial arms 418 include downward extending trenches 422 directly adjacent to pressing surfaces 420. Trenches 422 have a width greater than the width of sidewall 434 allowing sidewall 434 to be freely moved into and out of trenches 422.

To illustrate, radial arm 418A includes a first trench 422A of the plurality of trenches 422. Trench 422A is directly adjacent pressing surface 420A. The other radial arms 418 include the other trenches 422 in a similar manner.

Extending up from base section 432 of pocket driver 430 is a key 442. In this embodiment, key 442 is rectangular, e.g., square, when viewed from above. Key 442 is a locking feature, which locks pocket driver 430 to a pocket 450 of substrate holder 112A.

In one embodiment, pocket 450 includes body 451 and a pocket insert 453 mounted to body 451. Illustratively, body 451 is opaque quartz and pocket insert 453 is graphite. Body 451 and pocket insert 453 are referred to collectively as pocket 450.

Although pocket 450 is described and illustrated as including body 451 and pocket insert 453, in an alternative embodiment, pocket 450 is integral, i.e., body 451 and pocket insert 453 are parts of a single piece and are not separate pieces connected together.

Body 451 of pocket 450 includes a base 455 having a locking feature 454, e.g., a cavity, corresponding in shape to key 442. Body 451 of pocket 450 rests on base section 432 of pocket driver 430 such that key 442 fits into locking feature 454 in a lock and key arrangement. In alternative embodiments, instead of using key 442 and locking feature 454 to connect pocket 450 to pocket driver 430, pocket 450 and pocket driver 430 are connected using a different technique, e.g., by screws.

In yet another alternative embodiment, pocket 450 and pocket driver 430 are integral, i.e., are a single piece in not separate pieces connected together.

Pocket 450 is surrounded by a lift 452. Lift 452 includes a tab ring 456 mounted to a body 458 of lift 452. Body 458 extends down around pocket 450 and rests on pressing surfaces 420 of cross pin 410. Illustratively, body 458 is opaque quartz and tab ring 456 is graphite. Body 458 and tab ring 456 are referred to collectively as lift 452.

Tab ring 456 includes a plurality of tabs 460 extending radially inwards towards axis 114A of substrate holder 112A. Corresponding to tabs 460 are a plurality of notches 462 of pocket insert 453 of pocket 450. To illustrate, a first notch 462A of the plurality of notches 462 corresponds to a first tab 460A of the plurality of tabs 460. The other notches 462 correspond to the other tabs 460 in a similar manner.

Figure 5A:
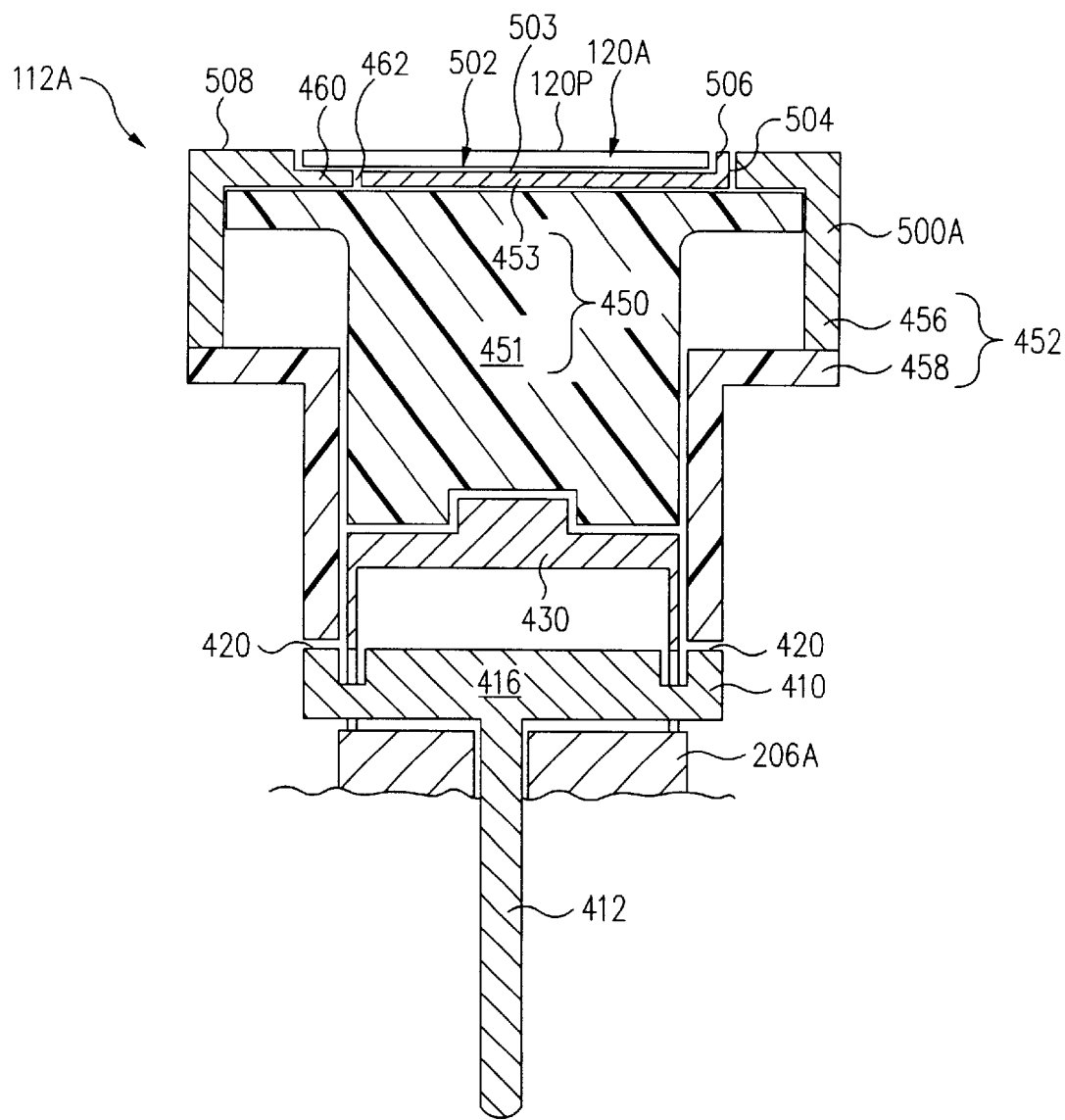
FIG. 5A is a cross-sectional view of the substrate holder of FIG. 4 supporting a substrate during processing.

FIG. 5A is a cross-sectional view of substrate holder 112A of FIG. 4 supporting substrate 120A during processing. Referring now to FIG. 5A, lift 452 is shown in a retracted position 500A. More particularly, cross member 416 of cross pin 410 is resting on pocket rotation gear 206A such that cross pin 410 is retracted. Since cross pin 410 is retracted, lift 452, which rests on pressing surfaces 420 of cross pin 410, is likewise retracted.

When lift 452 is retracted, i.e., moved to retracted position 500A, substrate 120A is placed in a recess 502, sometimes called a pocket, of pocket insert 453 of pocket 450. Specifically, pocket insert 453 of pocket 450 includes a planar substrate support surface 503 and a ring 504 extending up around a periphery of substrate support surface 503. Substrate support surface 503 in combination with ring 504 define recess 502. Also, tabs 460 are positioned in notches 462 when lift 452 is at retracting position 500A.

In this embodiment, ring 504 has a thickness approximately equal to the thickness of substrate 120A. For this reason, an outer annular surface 506 of ring 504 is substantially coplanar with a principal surface 120P of substrate 120A. Further, when lift 452 is at retracted position 500A, an outer annular surface 508 of tab ring 456 of lift 452 is likewise substantially coplanar with principal surface 120P of substrate 120A.

Referring again to FIG. 3, when lifts 452 are at retracted positions 500A, an exterior surface 106E of rotating susceptor 106A is likewise substantially coplanar with principal surfaces 120P of substrates 120. Accordingly, when lifts 452 are at retracted positions 500A, exterior surface 106E of rotating susceptor 106A, principal surfaces 120P of substrates 120, and outer annular surfaces 506, 508 of substrate holders 112 are presented as a single uniform surface.

In one embodiment, susceptor 106A includes a main body 107 on upper gear plate 342. Substrate holders 112 are in apertures of main body 107. To minimize any temperature variations across rotating susceptor 106A and, more importantly, across substrates 120, main body 107, lifts 452 and pockets 450 are quartz, e.g., GE 214 clear quartz. Further, exterior surface 106E and outer annular surfaces 506, 508 include a graphite coating. Alternatively, bodies 458, 451 of lift 452, pocket 450, respectively, are quartz and tab ring 456, pocket insert 453 of lift 452, pocket 450, respectively, are graphite. In either of the above manners, excellent uniformity of layer(s) formed on substrates 120 is achieved as those skilled in the art will understand.

Figure 5B:
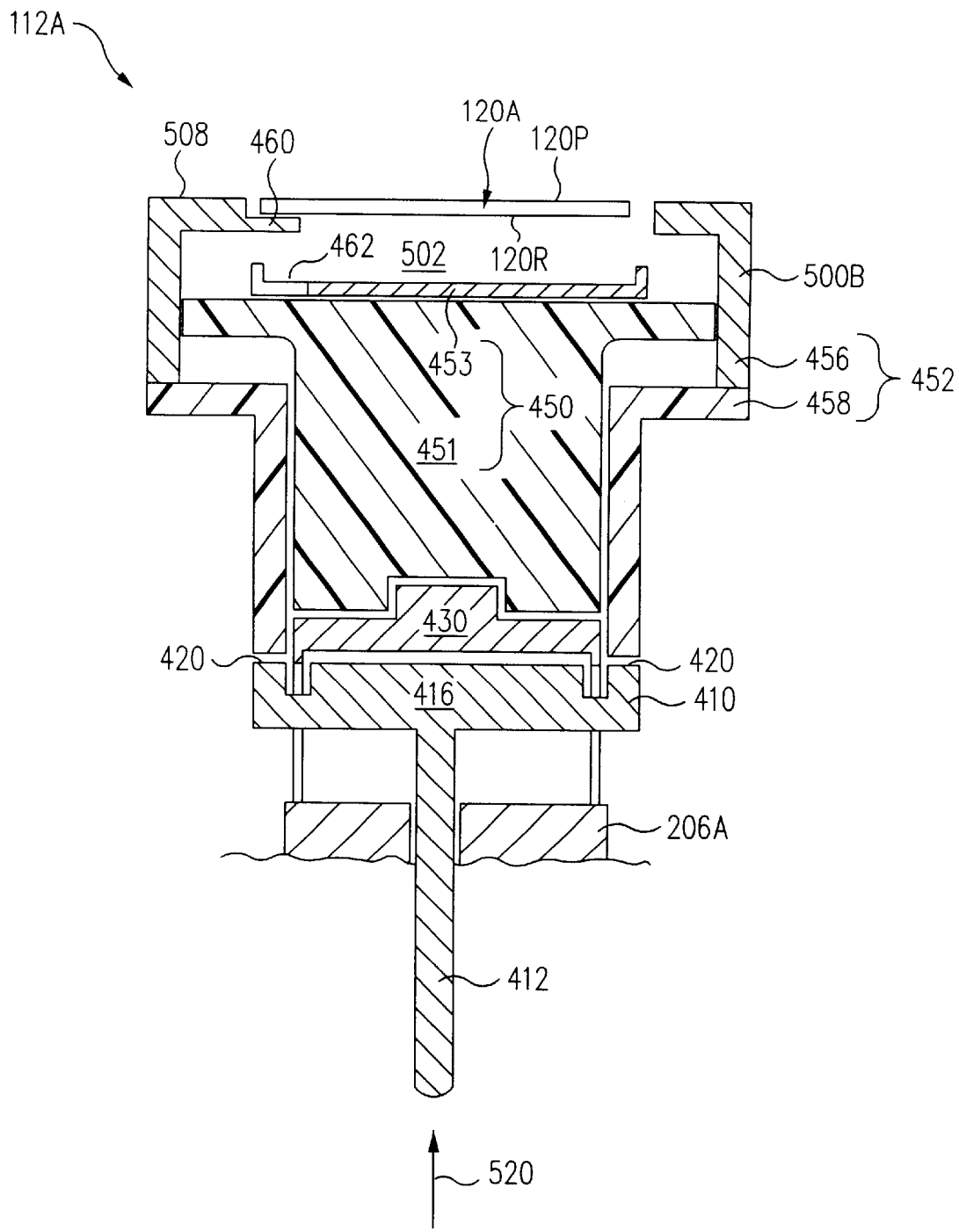
FIG. 5B is a cross-sectional view of the substrate holder of FIG. 5A lifting the substrate during loading/unloading.

FIG. 5B is a cross-sectional view of substrate holder 112A of FIG. 5A lifting substrate 120A during loading/unloading. Referring now to FIG. 5B, lift 452 is shown in an extended position 500B. When lift 452 is in extended position 500B, substrate 120A is elevated above pocket 450 for loading and unloading as described below.

To move lift 452 into extended position 500B and thus lift substrate 120A out of recess 502 of pocket 450, cross pin 410 is moved up relative to pocket 450. More particularly, pin 412 of cross pin 410 is pressed up and moved in the direction of arrow 520.

This causes pressing surfaces 420 of cross pin 410 to press up on body 458 of lift 452. Consequently, lift 452 moves up in the direction of arrow 520. This moves tabs 460 up out of notches 462 in pocket 450. Stated another way, when lift 452 is at extended position 500B, tabs 460 are positioned out of and above notches 462.

Since tabs 460 are located below substrate 120A, upwards motion of tabs 460 causes tabs 460 to press up on a backside surface 120R of substrate 120A and to lift substrate 120A out of recess 502 of pocket 450. Once lifted, substrate 120A is ready to be unloaded as described below.

Although unloading of substrate 120A out of recess 502 is described above, is understood that substrate 120A is loaded into recess 502 by reversing the above-mentioned procedure. More particularly, to load substrate 120A, substrate 120A is placed on tabs 460 as illustrated in FIG. 5B. Cross pin 410 is moved down in a direction opposite arrow 520, for example, by releasing pin 412. Since lift 452 rests on cross pin 410, this downwards motion of cross pin 410 causes lift 452 to move down in a direction opposite arrow 520. This moves tabs 460 into notches 462 thus lowering substrate 120A into recess 502 as shown in FIG. 5A.

As described above, lift 452 includes tabs 460. However, in alternative embodiments, instead of use of tabs 460, lift 452 includes other structures, e.g., pins, which lift substrate 120

Referring again to FIG. 3, cross pins 410 are moved up and down by a lift plate 372. Lift plate 372 is located in an enclosure 374 defined by internal coupling plate 322 and lower gear plate 340. Lift plate 372 moves up and down inside of enclosure 374 between base plate 322B of internal coupling plate 322 and lower gear plate 340.

This up and down motion, sometimes called longitudinal motion, of lift plate 372 is controlled by substrate lift motion mechanism 355. More particularly, lift plate 372 is mounted to driveshaft 344. Substrate lift motion mechanism 355 moves driveshaft 344, and hence lift plate 372, up and down.

Illustratively, substrate lift motion mechanism 355 includes an actuator piston 356. Actuator piston 356 is controlled, e.g., by selectively applying compressed air to ports (not shown) of substrate lift motion mechanism 355, in a manner similar to that described in Nishikawa, U.S. Pat. No. 6,213,478, cited above.

Actuator piston 356 is coupled to driveshaft 344. Hence, by controlling the up and down motion of actuator piston 356, driveshaft 344 is selectively moved up and down.

To facilitate the longitudinal motion of driveshaft 344, a spring 384 is located between substrate lift motion mechanism 355 and rotary-linear seal unit 352. To move driveshaft 344 up, actuator piston 356 is moved up towards rotary-linear seal unit 352 thus compressing spring 384. Conversely, to move driveshaft 344 down, actuator piston 356 is moved down away from rotary-linear seal unit 352. Spring 384 urges actuator piston 356 away from rotary-linear seal unit 352 assisting this downwards motion of driveshaft 344. Although rotation and longitudinal motion of driveshaft 344 by substrate lift motion mechanism 355 is described above, driveshaft 344 can be rotated and moved up and down using a variety of techniques and the particular technique used is not essential to the invention.

Pins 412 of cross pins 410 extend through pocket rotation gears 206 as described above in reference to FIG. 4. Pins 412 of cross pins 410 further extend into enclosure 374 and rest on lift plate 372. Thus, upwards motion of lift plate 372 causes lift plate 372 to press up on pins 412 of cross pins 410 and to move cross pins 410 up. This causes lifts 452, to move into extended position 500B as illustrated in FIG. 5B.

Figure 6:
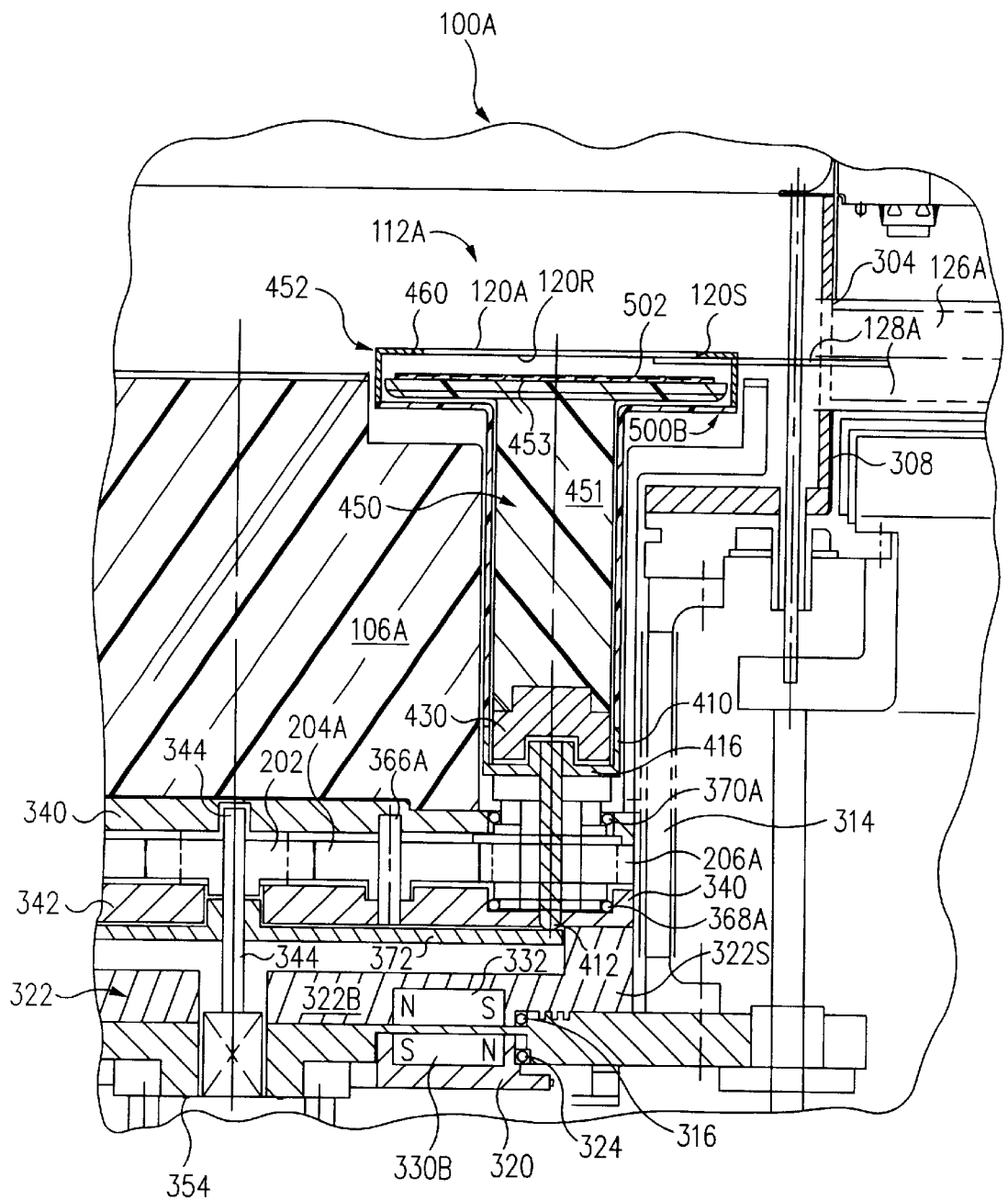
FIG. 6 is a partial side plan view, partially in cross-section, of the pancake reactor of FIG. 3 during loading of a substrate on a substrate holder.

FIG. 6 is a partial side plan view, partially in cross-section, of pancake reactor 100A of FIG. 3 during loading of substrate 120A on substrate holder 112A. As shown in FIG. 6, lift 452 is at extended position 500B. Correspondingly, lift plate 372 is up and adjacent lower gear plate 340 and crossmember 416 of cross pin 410 is elevated above pocket rotation gear 206A as illustrated in FIG. 6. Lift 452 is moved to extended position 500B as described above in reference to FIG. 5B.

Figure 7:
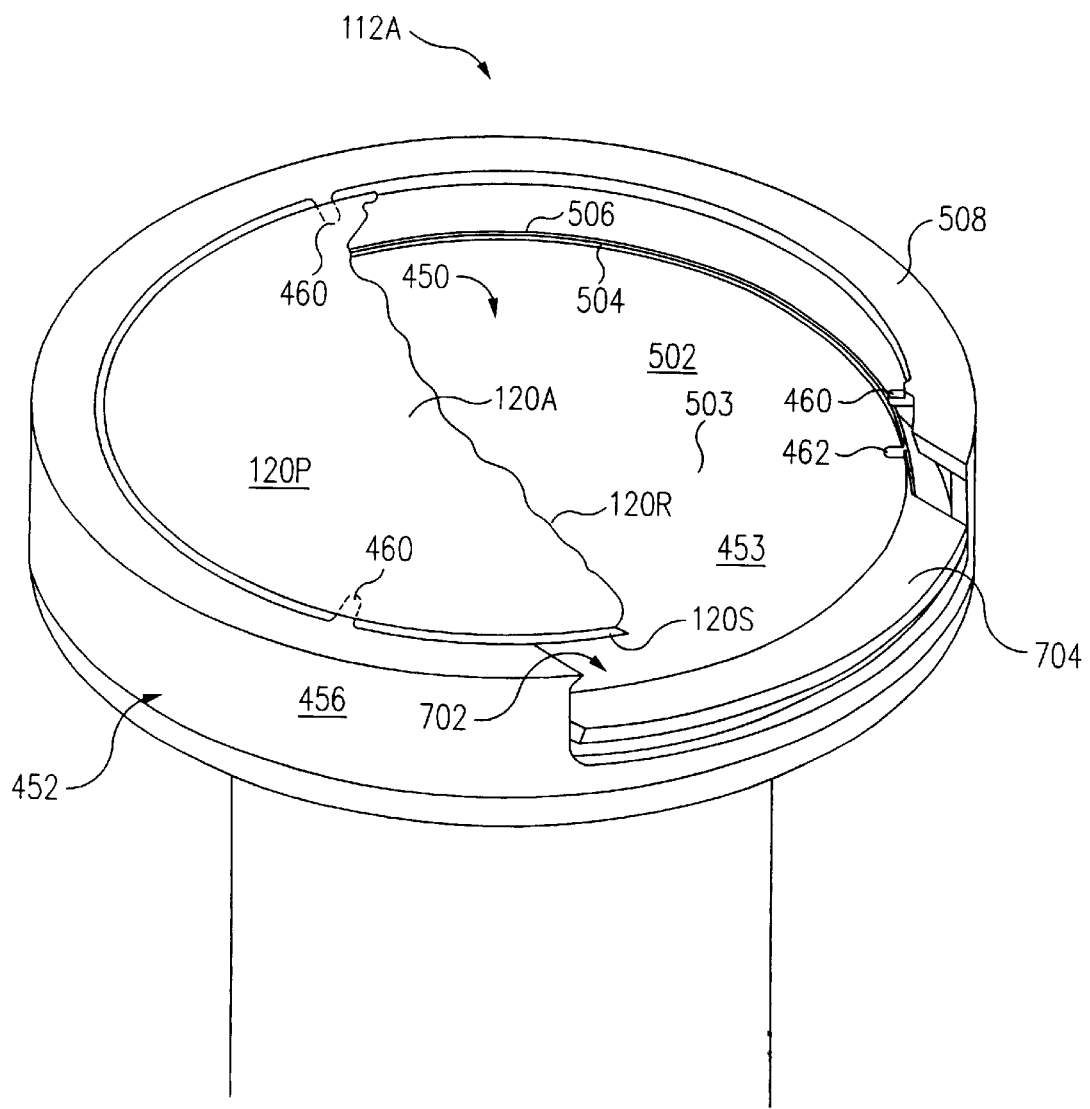
FIG. 7 is a perspective view, partially cutaway, of the substrate holder of FIG. 6 supporting the substrate.

FIG. 7 is a perspective view, partially cutaway, of substrate holder 112A of FIG. 6 supporting substrate 120A. In FIG. 7, substrate 120A is partially cutaway for purposes of clarity.

Referring now to FIG. 7, lift 452 includes a cutaway 702. More particularly, cutaway 702 is formed in tab ring 456 of lift 452. Cutaway 702 is a notch extending down from outer annular surface 508 of lift 452.

Corresponding to cutaway 702 is a flange 704 of pocket insert 453 of pocket 450. More particularly, outer annular surface 508 of lift 452 is in the shape of an annulus having a portion missing at cutaway 702. Flange 704 corresponds in shape to the missing portion of outer annular surface 508. Flange 704 extends radially outwards from ring 504 of pocket insert 453 of pocket 450.

Referring again to FIG. 1A, in one embodiment, a computer 150 is used to control pancake reactor 100. For example, referring now to FIGS. 1A and 3 together, computer 150 controls the operation of susceptor motor 318 and thus the rotation of rotating susceptor 106A. Further, computer 150 controls the operation of substrate holder motor 362 and thus the rotation of substrate holders 112. Generally, computer 150 controls the operation of pancake reactor 10A.

Computer 150 is a conventional digital computer and it is well within the skill of one skilled in the art of computer programming to program computer 150 to accomplish the specific task in view of this disclosure. The particular digital computer utilized, the computer operating system, and computer program language utilized are not essential to the invention and typically are determined by the process computer used with pancake reactor 10A.

As described below in reference to FIGS. 8A and 8B, computer 150 performs certain functions and/or has certain attributes. However, those of skill in the art will understand that such functions and/or attributes result from execution of instructions by computer 150.

Figure 8A:
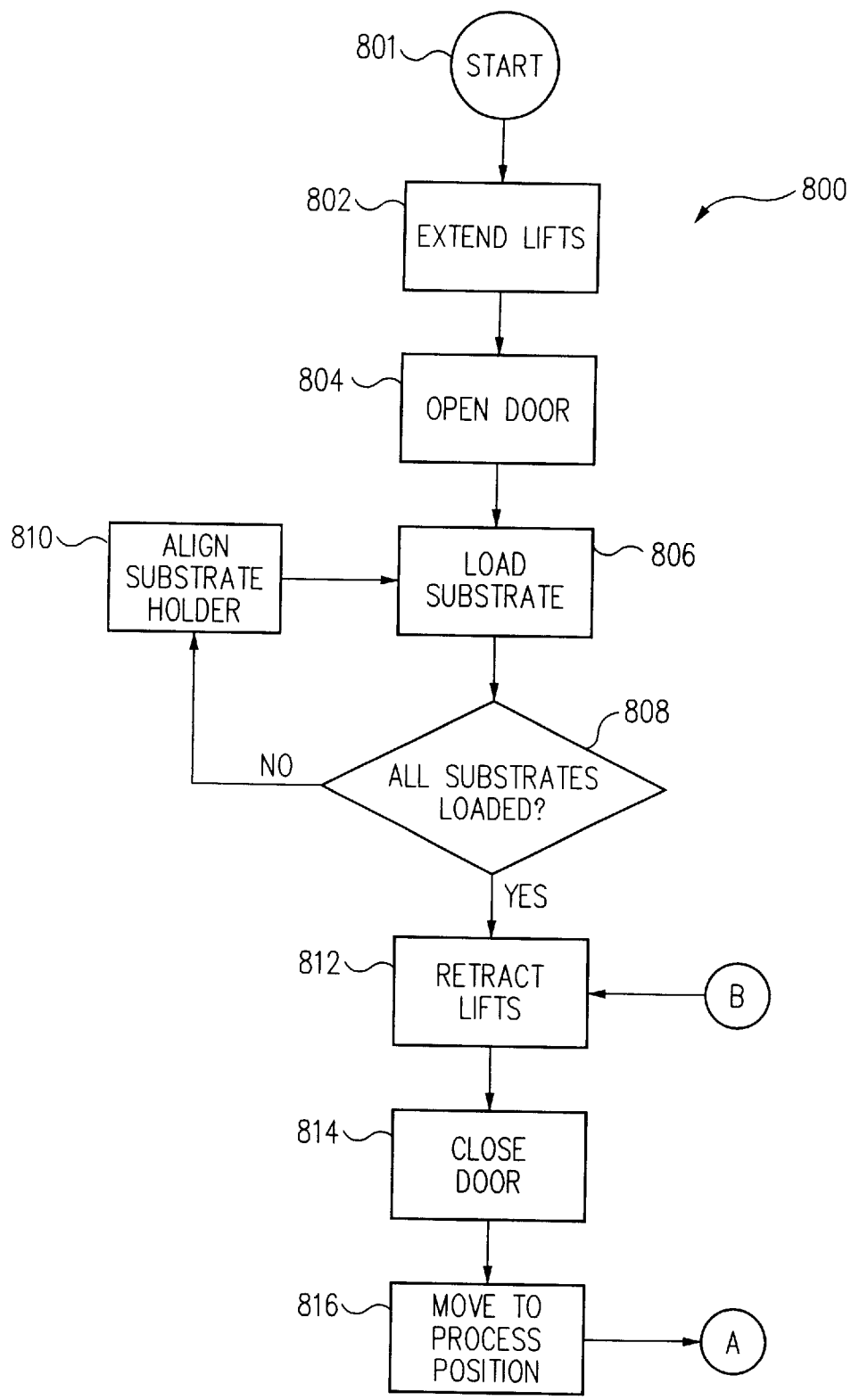
FIGS. 8A and 8B are a block diagram illustrating operations in a process for which a rotating susceptor is used in accordance with one embodiment of the present invention.
Figure 8B:
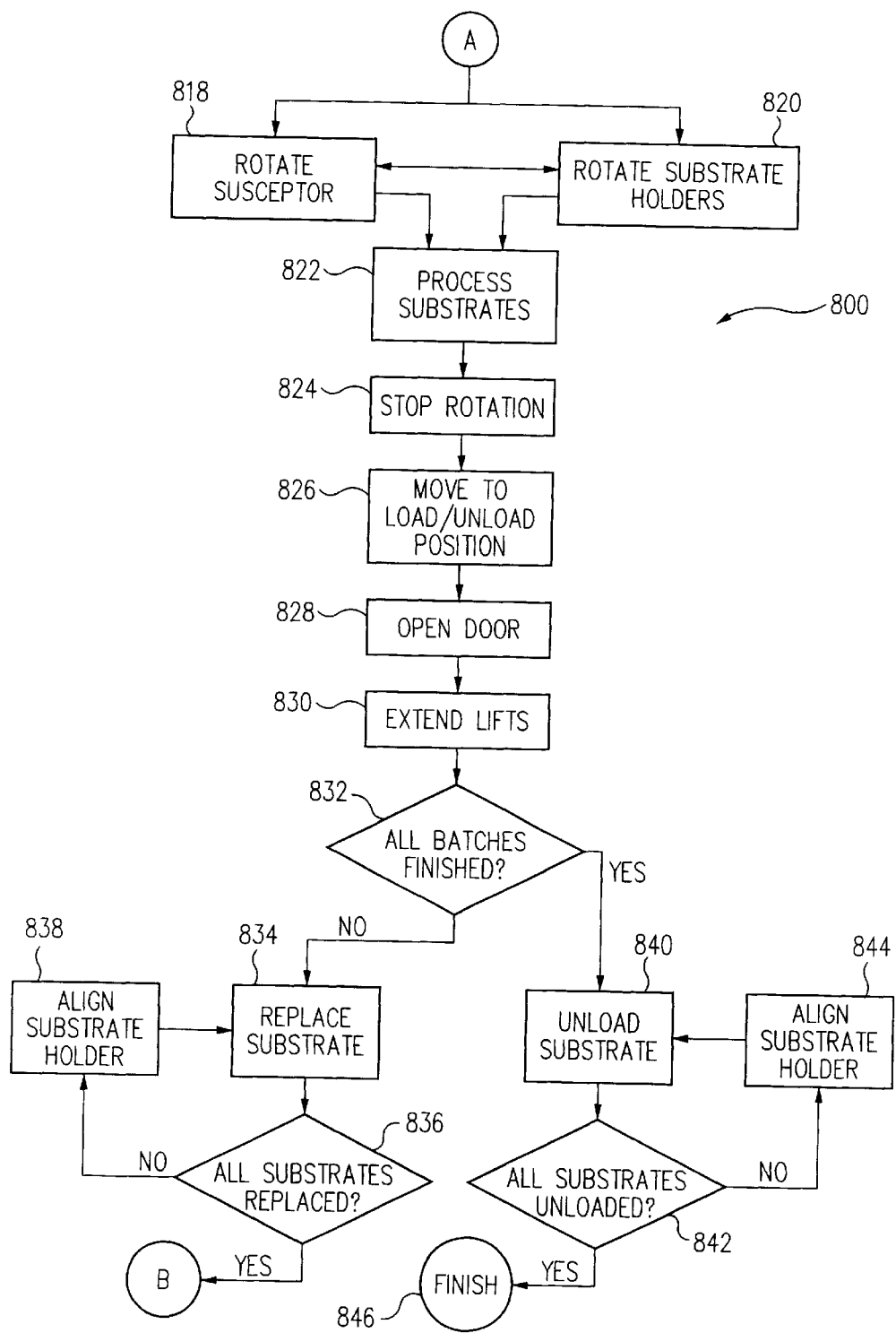

FIGS. 8A and 8B, collectively referred to as FIG. 8, are a block diagram 800 illustrating operations in a process for which rotating susceptor 106A (FIG. 6) is used in accordance with one embodiment of the present invention. Referring now to FIGS. 6, 7 and 8 together, initially from a Start Operation 801, at an Extend Lifts Operation 802, lifts 452 are moved to extended positions 500B, if lifts 452 are not already at extended positions 500B. To load substrate 120A onto lift 452, door 304 of robot port 126A is opened at an Open Door Operation 804, if door 304 is not already open.

At a Load Substrate Operation 806, substrate 120A is loaded on substrate holder 112A, i.e., placed on lift 452. More particularly, a robot arm 128A grasps substrate 120A, e.g., on backside, surface 120R or edge 120S of substrate 120A. Robot arm 128A extends through robot port 126A and moves substrate 120A above lift 452. Robot arm 128A moves down and places substrate 120A on tabs 460 of lift 452 as best illustrated in FIG. 7.

Advantageously, robot arm 128A is located within cutaway 702, which accommodates motion of robot arm 128A. More particularly, robot arm 128A is located within cutaway 702 vertically between flange 704 of pocket insert 453 of pocket 450 and substrate 120A.

At an All Substrates Loaded Operation 808, a determination is made whether or not all of substrates 120 are loaded on substrate holders 112. If not, then at an Align Substrate Holder Operation 810, rotating susceptor 106A is rotated until another substrate holder 112 is aligned with robot port 126A.

At Load Substrate Operation 806, another substrate 120 to be processed is loaded on the substrate holder 112 now aligned with robot port 126A. Operations 806, 808, and 810 are repeated until all substrates 120 are loaded into pancake reactor 100A. Advantageously, substrates 120 are loaded into pancake reactor 100A automatically by robot arm 128A and without manual intervention. Accordingly, throughput of substrates 120 is maximized which, in turn, minimizes the cost of processing substrates 120.

Figure 9:
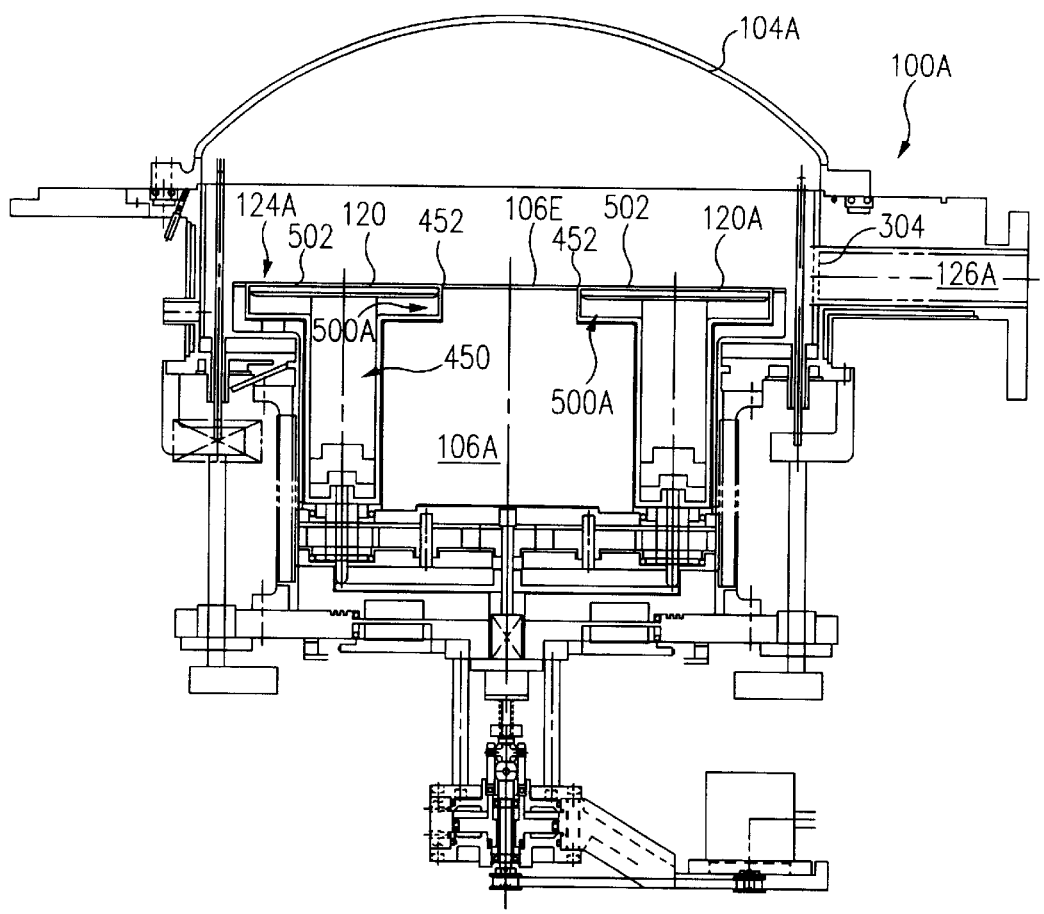
FIG. 9 is a side plan view, partially in cross-section, of the pancake reactor of FIG. 6 at a further stage during processing of substrates.

FIG. 9 is a side plan view, partially in cross-section, of pancake reactor 100A of FIG. 6 at a further stage during processing of substrates 120. Referring now to FIGS. 8 and 9 together, after a determination is made that all of substrates 120 are placed on lifts 452 of substrate holders. 112 at All Substrates Loaded Operation 808, lifts 452 are retracted and moved to retracted positions 500A at a Retract Lifts Operation 812. Accordingly, substrates 120 are placed in recesses 502 of pockets 450 as described above in reference to FIGS. 5A and 5B. Door 304 is then closed at a Close Door Operation 814.

Referring now to FIGS. 3, 8 and 9 together, at a Move to Process Position Operation 816, rotating susceptor 106A is moved up from a load/unload position 124A (FIG. 9) to a process position 123A (FIG. 3). Generally, exterior surface 106E of rotating susceptor 106A is aligned with or below robot port 126A when rotating susceptor 106A is at load/unload position 124A as shown in FIG. 9. In contrast, exterior surface 106E of rotating susceptor 106A is adjacent, sometimes called within, dome 104A when rotating susceptor 106A is at process position 123A as shown in FIG. 3.

Although Retract Lifts Operation 812 is described as preceding Close Door Operation 814 and Close Door Operation 814 is described as preceding Move to Process Position Operation 816, in alternative embodiments, operations 812, 814, and/or 816 are performed in a different order or simultaneously.

Although movement of rotating susceptor 106A from load/unload position 124A to process position 123A is described above, in an alternative embodiment, rotating susceptor 106A remains at load/unload position 124A during the entire processing of substrates 120, i.e., does not move up and down. Stated another way, Move To Process Position Operation 816 is optional.

Referring now to FIGS. 3 and 8, rotating susceptor 106A is rotated at a Rotate Susceptor Operation 818. Substrate holders 112 are rotated at a Rotate Substrate Holders Operation 820. In one embodiment, both Rotate Susceptor Operation 818 and Rotate Substrate Holders Operation 820 are performed simultaneously or sequentially. In alternative embodiments, either Rotate Susceptor Operation 818 or Rotate Substrate Holders Operation 820 is performed, but not both.

At a Process Substrates Operation 822, substrates 120 are processed. Illustratively, a layer is formed on substrates 120, substrates 120 are doped and/or substrates 120 are etched, or otherwise processed.

After processing of substrates 120, any rotation of rotating susceptor 106A and/or substrate holders 112 is stopped at a Stop Rotation Operation 824. Although Rotate Susceptor Operation 818 and Rotate Substrate Holders Operation 820 are described as being initiated prior to Process Substrates Operation 822, in an alternative embodiment, Rotate Susceptor Operation 818 and/or Rotate Substrate Holders Operation 820 are initiated during Process Substrates Operation 822. Further, although Stop Rotation Operation 824 is described as being initiated after Process Substrates Operation 822 is complete, in an alternative embodiment, Stop Rotation Operation 824 is initiated during Process Substrates Operation 822.

If Move to Process Position Operation 816 was performed, rotating susceptor 106A is moved from process position 123A (FIG. 3) to load/unload position 124A (FIG. 9) at a Move to Load/Unload Position Operation 826.

Referring again to FIGS. 6, 7 and 8 together, door 304 of robot port 126A is opened at an Open Door Operation 828. The processed substrates 120 are lifted out of recesses 502 of pockets 450 by lifts 452 at Extend Lifts Operation 830. More particularly, lifts 452 are move to be in extended positions 500B.

Although Move to Load/Unload Position Operation 826 is described as preceding Open Door Operation 828 and Open Door Operation 828 is described as preceding Extend Lifts Operation 830, in alternative embodiments, operations 826, 828, and/or 830 are performed in a different order or simultaneously.

At all Batches Finished Operation 832, a determination is made whether all batches of substrates 120 have been processed, i.e., whether the present batch of processed substrates 120 is the last batch of substrates 120 to be processed.

If there are additional batches of substrates 120 to be processed, then at a Replace Substrate Operation 834, a substrate 120, which has been processed, is replaced with a new substrate 120 to be processed.

To replace a processed substrate 120 with a new substrate 120, robot arm 128A extends through robot port 126A, through cutaway 702 and under the processed substrate 120. Robot arm 128A moves up and grasps the processed substrate 120. Robot arm 128A lifts the processed substrate up and off of tabs 460 of lift 452.

Robot arm 128A removes the processed substrate 120 out of pancake reactor 100A and out of robot port 126A, e.g., into a substrate carrier. A new substrate 120 is then loaded as described above in Load Substrate Operation 806.

At All Substrates Replaced Operation 836, a determination is made whether or not all of the processed substrates 120 have been replaced with new substrates 120. If not, then at an Align Substrate Holder Operation 838, rotating susceptor 106A is rotated until another substrate holder 112 is aligned with robot port 126A. The processed substrate 120 on the substrate holder 112 now aligned with robot port 126A is replaced with a new substrate 120 at Replace Substrate Operation 834. Operations 834, 836, and 838 are repeated until all of the processed substrates 120 are replaced with new substrates 120. Advantageously, the processed substrates 120 are replaced with new substrates 120 automatically and without manual intervention. Process flow then moves from All Substrates Replaced Operation 836 to Retract Lifts Operation 812.

However, if at All Batches Finished Operation 832 a determination is made that there are no additional batches of substrates 120 to be processed, then at an Unload Substrate Operation 840, a processed substrate 120 is unloaded out of pancake reactor 100A.

To unload a processed substrate 120, robot arm 128A extends through robot port 126A, through cutaway 702 and under the processed substrate 120. Robot arm 128A moves up and grasps the processed substrate 120. Robot arm 128A lifts the processed substrate up and off of tabs 460 of lift 452. Robot arm 128A removes the processed substrate 120 out of pancake reactor 100A and out of robot port 126A, e.g., into a substrate carrier.

At All Substrates Unloaded Operation 842, a determination is made whether or not all of the processed substrates 120 have been unloaded. If not, then at an Align Substrate Holder Operation 844, rotating susceptor 106A is rotated until another substrate holder 112 is aligned with robot port 126A. The processed substrate 120 on the substrate holder 112 now aligned with robot port 126A is unloaded at Unload Substrate Operation 840. Operations 840, 842, and 844 are repeated until all of the processed substrates 120 are unloaded. Advantageously, the processed substrates 120 are unloaded automatically and without manual intervention. Process flow then moves from All Substrates Unloaded Operation 842 to a Finish Operation 846.

Although Load Substrate Operation 806, Replace Substrate Operation 834 and Unload Substrate Operation 840 are described above as being performed with robot arm 128A, i.e., automatically and without manual intervention, in alternative embodiments, Load Substrate Operation 806, Replace Substrate Operation 834, and Unload Substrate Operation 840 are performed manually, e.g., by hand.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A semiconductor processing reactor comprising:
   a rotating susceptor including a substrate holder;
   a main driver gear;
   a driveshaft slidably mounted to said main driver gear;
   a coupling gear coupled to said main driver gear and coupled to a pocket rotation gear of said substrate holder;
   a first gear plate;
   a second gear plate, wherein said main driver gear, said coupling gear, and said pocket rotation gear are supported by said first gear plate and said second gear plate; and
   a coupling gear spindle mounted between said first gear plate and said second gear plate, said coupling gear being mounted on said coupling gear spindle.

2. The semiconductor processing reactor of claim 1 further comprising a first motor coupled to said rotating susceptor; and
   a second motor coupled to said substrate holder.

3. The semiconductor processing reactor of claim 2 wherein said rotating susceptor and said substrate holder are rotatable, said first motor controlling rotation of said rotating susceptor, said second motor controlling rotation of said substrate holder.

4. The semiconductor processing reactor of claim 3 wherein said rotating susceptor and said substrate holder are rotated, said rotation of said rotating susceptor being independent of said rotation of said substrate holder.

5. The semiconductor processing reactor of claim 1 wherein said rotating susceptor and said substrate holder are independently rotatable and wherein said substrate holder comprises:
   a pocket; and
   a lift.

6. The semiconductor processing reactor of claim 5 further comprising a robot arm.

7. The semiconductor processing reactor of claim 5 further comprising a robot port aligned with said substrate holder.

8. The semiconductor processing reactor of claim 5 wherein said pocket comprises a notch and wherein said lift comprises a tab corresponding to said notch.

9. The semiconductor processing reactor of claim 8 wherein said tab is positioned in said notch, said lift being in a retracted positioned.

10. A semiconductor processing reactor comprising:
   a rotating susceptor including a substrate holder;
   a main driver gear;
   a driveshaft slidably mounted to said main driver gear;
   a coupling gear coupled to said main driver gear and coupled to a pocket rotation gear of said substrate holder;
   a first gear plate;
   a second gear plate, wherein said main driver gear, said coupling gear, and said pocket rotation gear are supported by said first gear plate and said second gear plate; and
   wherein said pocket rotation gear is mounted to said first gear plate and to said second gear plate by bearings.

11. The semiconductor processing reactor of claim 10 further comprising a first motor coupled to said rotating susceptor; and
   a second motor coupled to said substrate holder.

12. The semiconductor processing reactor of claim 11 wherein said rotating susceptor and said substrate holder are rotatable, said first motor controlling rotation of said rotating susceptor, said second motor controlling rotation of said substrate holder.

13. The semiconductor processing reactor of claim 12 wherein said rotating susceptor and said substrate holder are rotated, said rotation of said rotating susceptor being independent of said rotation of said substrate holder.

14. The semiconductor processing reactor of claim 10 wherein said rotating susceptor and said substrate holder are independently rotatable and wherein said substrate holder comprises:
   a pocket; and
   a lift.

15. The semiconductor processing reactor of claim 14 further comprising a robot arm.

16. The semiconductor processing reactor of claim 14 further comprising a robot port aligned with said substrate holder.

17. The semiconductor processing reactor of claim 14 wherein said pocket comprises a notch and wherein said lift comprises a tab corresponding to said notch.

18. The semiconductor processing reactor of claim 17 wherein said tab is positioned in said notch, said lift being in a retracted positioned.

19. A semiconductor processing reactor comprising;
   a rotating susceptor including a substrate holder;
   a main driver gear;
   a driveshaft slidably mounted to said main driver gear;
   a coupling gear coupled to said main driver gear and coupled to a pocket rotation gear of said substrate holder, wherein said substrate holder comprises:
      a lift; and
      a cross pin comprising a pressing surface, wherein said lift rests on said pressing surface of said cross pin.

20. The semiconductor processing reactor of claim 19 further comprising a lift plate mounted to said driveshaft, said cross pin comprises a pin extending through an aperture of said pocket rotation gear and resting on said lift plate.

21. The semiconductor processing reactor of claim 19 further comprising a first motor coupled to said rotating susceptor; and
   a second motor coupled to said substrate holder.

22. The semiconductor processing reactor of claim 21 further comprising a robot arm.

23. The semiconductor processing reactor of claim 21 further comprising a robot port aligned with said substrate holder.

24. A semiconductor processing reactor comprising:
   a rotating susceptor including a substrate.holder, wherein said rotating susceptor comprises an internal coupling plate;
   a main driver gear;
   a driveshaft slidably mounted to said main driver gear;
   a coupling gear coupled to said main driver gear and coupled to a pocket rotation gear of said substrate holder;
   a housing;
   an external coupling plate magnetically coupled to said internal coupling plate through said housing; and
   a motor directly connected to said external coupling plate.

25. The semiconductor processing reactor of claim 22 wherein said motor is a first motor coupled to said rotating susceptor, said semiconductor processing reactor further comprising a second motor coupled to said substrate holder.

26. The semiconductor processing reactor of claim 25 further comprising a robot arm.

27. The semiconductor processing reactor of claim 25 further comprising a robot port aligned with said substrate holder.

* * * * *